United States Patent
Clifton et al.

(10) Patent No.: US 7,102,660 B2
(45) Date of Patent: Sep. 5, 2006

(54) THERMAL TRANSFER PRINTING

(75) Inventors: Andrew Alec Clifton, Ipswich (GB); Jeffrey Michael Howell, Ipswich (GB)

(73) Assignee: Imperial Chemical Industries PLC, London (GB)

( * ) Notice: Subject to any disclaimer, the term of this patent is extended or adjusted under 35 U.S.C. 154(b) by 254 days.

(21) Appl. No.: 10/478,645

(22) PCT Filed: May 29, 2002

(86) PCT No.: PCT/GB02/02515

§ 371 (c)(1), (2), (4) Date: Nov. 25, 2003

(87) PCT Pub. No.: WO02/096661

PCT Pub. Date: Dec. 5, 2002

(65) Prior Publication Data

US 2004/0165055 A1 Aug. 26, 2004

(30) Foreign Application Priority Data

Jun. 1, 2001 (GB) .............................. 0113332

(51) Int. Cl.
*B41J 2/325* (2006.01)

(52) U.S. Cl. ........................................ 347/217; 347/213
(58) Field of Classification Search ................. 347/217, 347/213, 212, 176, 171; 346/135.1; 503/227
See application file for complete search history.

(56) References Cited

U.S. PATENT DOCUMENTS

| | | | | |
|---|---|---|---|---|
| 4,568,949 A | * | 2/1986 | Muranaka | 347/176 |
| 4,664,672 A | | 5/1987 | Krajec et al. | |
| 5,438,348 A | * | 8/1995 | Imai et al. | 346/135.1 |
| 5,841,462 A | * | 11/1998 | Matsuo et al. | 347/213 |

FOREIGN PATENT DOCUMENTS

WO 00/74946 12/2000

* cited by examiner

*Primary Examiner*—K. Feggins
(74) *Attorney, Agent, or Firm*—Morgan, Lewis & Bockius LLP

(57) ABSTRACT

An article for receiving an image by thermal transfer printing includes an image-receiving surface of plastics material coated with a layer of dye-receptive material capable of accepting an image by means of a dye thermal transfer process, wherein the glass transition temperature (Tg) of the dye receptive material is at least 50° C. lower than the softening point of the plastics material of the image-receiving surface. By having a difference between the softening point of the plastics material article surface and the Tg of the material coated thereon of at least 50° C. it is possible to achieve printing in a single step transfer process of high density images without distortion of the plastics material. The invention can be used with three-dimensional articles possibly having compound curves, including casings for mobile telephones made of polymers such as polycarbonate.

18 Claims, 1 Drawing Sheet

THERMAL TRANSFER PRINTING

FIELD OF THE INVENTION

This invention relates to thermal transfer printing, and particularly concerns an article for receiving an image by thermal transfer printing, a method of printing and an article bearing a printed image.

BACKGROUND TO THE INVENTION

Thermal transfer printing, in the context of the present specification, is used to mean a process in which an image on a carrier sheet is printed onto an image-receiving surface of an article by placing the image in contact with said surface of the article, and heating the image to transfer the image onto the article surface. Usually force is applied to exert pressure on the sheet and maintain the sheet in contact with the surface during printing.

The image is typically formed on the carrier sheet by a first printing step. In this case, the overall two stage process can be considered as a retransfer printing process. Retransfer printing techniques are commonly used for printing on articles other than flexible sheet material.

One example of a retransfer printing process is dye diffusion thermal retransfer printing. In a first stage, an image is formed by dye diffusion thermal transfer printing on a retransfer intermediate carrier sheet. Dye diffusion thermal transfer printing is a process in which one or more thermally transferable dyes are caused to transfer from selected areas of a dye-donor sheet to a receiver by thermal stimuli, thereby to form an image. This is generally carried out in a printer having a thermal head or laser energy source, depending on the kind of dye-donor sheet used. Using a dye-donor sheet comprising a thin substrate supporting a dyecoat containing one or more uniformly spread dyes, printing is effected by heating selected discrete areas of the dye-donor sheet while the dyecoat is pressed against a dye-receptive surface of a receiver sheet, thereby causing dye to transfer to corresponding areas of the receiver. The shape of the image transferred is determined by the number and locations of the discrete areas which are subjected to heating. Full colour images can be produced by printing with different coloured dyecoats sequentially in like manner, and the different coloured dyecoats are usually provided as discrete uniform panels arranged in a repeated sequence along a ribbon-shaped dye-donor sheet or ink ribbon. In retransfer printing, the receiver sheet is in the form of a retransfer intermediate sheet which comprises a supporting substrate having a dye-receptive imageable layer on one side, usually with a backcoat on the other side to promote good transport through the initial printer. Suitable retransfer intermediate sheets are disclosed, e.g, in WO 98/02315 (EP 912349). The image-carrying intermediate sheet formed in the first stage of the process is separated from the dye-donor sheet, and in the second stage of the process, is pressed against the article, with its image-containing layer contacting a dye-receptive surface of the article. Heat is then applied to effect transfer of the image, usually over the whole area of the image simultaneously. This is commonly carried out in a press shaped to accommodate the article. See, for example, the mug press disclosed in U.S. Pat. No. 5,643,387.

Thermal retransfer techniques are of particular applicability to the customisation of three dimensional articles such as mugs and tiles made of materials of high thermal stability that can withstand the temperatures involved without distortion. The carrier sheet can be printed by a desktop printer, and the press can retransfer the image in less than 5 minutes. Thus the method has advantages over direct printing by silk-screen, offset or gravure processes because it can add personalisation at point-of-sale.

In general, prior art thermal retransfer techniques can only be used with articles made of materials able to withstand the elevated temperatures (and possibly also elevated pressures) involved without distorting or breaking, typically being restricted to articles of metal or refractory materials such as ceramics. This applies, e.g., to the mug press disclosed in U.S. Pat. No. 5,643,387, which employs high pressures to ensure compliance of the press with the surface of the mug to be printed, restricting the approach to refractory objects of certain forms (having only simple curves, in only one plane) which do not distort or break at the temperatures and pressures involved.

The specification of British Patent Application No 0100330.0 filed $6^{th}$ Jan. 2001 (pursued as PCT/GB02/00037) discloses apparatus for printing an image onto an image-receiving surface of an article by a thermal transfer printing process, the apparatus comprising a heat-conductive member comprising foamed polymeric elastomer material and having a surface shaped to be substantially complementary to the image-receiving surface of the article; and means for heating the member.

In use, a carrier sheet of material bearing an image to be printed is held in contact with the image-receiving surface of the article by the member, via the complementary surface of the member. Typically, a sheet is located on the article in an appropriate position and the member is brought into contact with the exposed face of the sheet and force applied to exert pressure on the sheet sufficient to promote wetting contact between the sheet and the member. The member is heated by the heating means, possibly being pre-heated to a desired temperature prior to contact with the sheet and/or prior to contact of the sheet with the article. The sheet is held in contact with the article for a suitable time with the member at a suitable temperature to print the image on the surface of the article. Suitable printing conditions can be readily determined by experiment. The member is removed and the article allowed or caused to cool to ambient temperature. The sheet is usually removed from the article surface.

Because heat is applied via the member, rather than being applied via the article, the article is exposed to less heat. The apparatus therefore enables printing to be performed on articles of a wider range of materials than had been possible hitherto. In particular, it is possible to print on articles of thermoplastic materials such as many widely used polymers such as acetal resin, acrylic resins, polycarbonates etc, provided the article is suitably supported when heated so the shape of the article is retained.

The apparatus accordingly desirably includes a support for the article, shaped to support or receive the article while leaving exposed the image-receiving surface thereof. In embodiments intended for use in printing articles of thermoplastic material, the support should be shaped to be complementary to a part of the article so as fully to support the article with a snug fit. The support will be discussed further below.

During printing, the sheet should be held firmly in contact with the article to produce a print of good quality. The apparatus therefore preferably includes suitable urging means, eg for applying force between the member and support, e.g. in the form of a spring loading arrangement or a hydraulic system.

The member comprises foamed material, ie. material including a plurality of small openings, pockets or voids within the body of the material. The voids are typically filled with gas, commonly air. The voids should be small (preferably having a maximum dimension less than 1 mm) and are ideally substantially uniform in size and are preferably reasonably uniformly dispersed through the material, for uniformity of properties, such that any variation in conductivity is not such as to produce prints with a variation in optical density. The presence of the voids, coupled with the elastomeric nature of the member material, mean that the member is relatively soft and has a degree of elasticity and so can, if necessary, deform to an extent (at least when heated) to enable the surface thereof to conform to the image-receiving surface of an article, thus providing uniform contact between the member and article. Provided the member is sufficiently compliant to allow good wetting contact with the sheet and article under compression, variation between the shape of the member and article surfaces is tolerable. Thus, while said surface of the member should be shaped to be substantially complementary to the image-receiving surface of the article, exact complementarity is not required as a degree of variation can be accommodated by the deformability of the member. The degree of variation tolerable will depend on factors including the degree of deformability of the member, the pressure applied in use and the complexity of shape of the image-receiving surface of the article. References to "substantially complementary" in this context should be construed accordingly.

The void volume of the material should be selected to give desired properties, and should be sufficiently high to provide the necessary elasticity without being so high as to adversely affect thermal conductivity. Generally, the void volume is in the range of 5 to 35% by volume, typically being about 10% by volume.

Suitable foamed polymeric elastomer materials are well known to those skilled in the art, and are commercially available or can be produced by known techniques. A foamed material can be created with a controlled void level by several means, including but not limited to mechanical entrainment of gas, adding volatile liquids, dissolving gases in one or more components, using a chemical reaction which evolves gas, adding a material which decomposes to evolve a gas during curing. For example, air-filled voids can be created by vigorously mixing material with air to generate an aerated paste which sets, eg on addition of a curing agent, to produce a solid foamed material.

The foamed polymeric elastomer material preferably comprises a foamed silicone resin, but other foamed polymers that exhibit sufficient flexibility under printing conditions may alternatively be employed. Suitable materials are commercially available.

The member comprising foamed polymeric elastomer material is heat conductive so that in use heat can be conducted through the member to an image-bearing sheet in contact with the article. It is desirable for the member to have relatively high thermal conductivity properties so that in use the sheet reaches the transfer temperature rapidly, thus avoiding the need for prolonged exposure of the article to elevated temperatures and so reducing the likelihood of thermal degradation of the article. The member preferably has a thermal conductivity of at least 0.2 W/m/K, and in general desirably has as high a thermal conductivity as possible provided other properties are not compromised.

The presence of voids in the polymeric elastomer material reduces the thermal conductivity of the material. In order to raise the thermal conductivity, preferably to a value greater than that of the polymeric elastomer material in unvoided, unfoamed condition (eg unfoamed silicone resin), it is convenient to include in the material particles of high thermal conductivity material, having a thermal conductivity greater than that of the polymeric elastomer material and typically having a thermal conductivity of at least 1 W/m/K. Suitable high thermal conductivity materials include metals and metal oxides. The particles should be reasonably uniformly dispersed through the material, for uniformity of properties. The particles are preferably spherical or near spherical in form and relatively uniform in size in order not to affect adversely the flexibility and deformability of the member. For the same reason, the particles are preferably relatively small, eg having a maximum particle size in the range 3 to 30 microns. The particles also desirably have a maximum dimension less than 0.2 mm to avoid the risk of surface roughness of the member that might deform and emboss the article in use. The particles are desirably present in sufficient quantity to ensure that the image reaches and stays at the transfer temperature for printing for the required period of time, without being present at such high levels that flexibility of the material is compromised. Suitable particle loadings can be readily determined by experiment. The particles are preferably present at a level of at least about 10% of the volume, more preferably at least about 15% or more of the volume of the material.

The member is preferably made of material that is substantially isotropic, having voids, and particles if present, reasonably uniformly distributed therethrough.

The means for heating the member conveniently comprises a heatable plate or jacket in contact with the member other than said shaped surface thereof. The plate or jacket may be heatable in known manner, eg incorporating or being linked to electrically operated heating elements.

Alternatively or additionally, the member be rendered electrically conductive by the incorporation in the foamed material of particles of electrically conductive material, preferably carbon, so that the member may be heated by the passage of an electrical current therethrough.

The apparatus preferably includes a support, as noted above.

The support preferably has a lower thermal conductivity than that of the member, eg being of the same base material as the member but not in foamed condition and without added particles of high thermal conductivity material. For instance, the support conveniently comprises unfoamed silicone resin. This is because, in use, heat flow through an article tends towards a steady-state value during printing. Unless the thermal conductivity of the support is less than that of the foam, the support will suck heat away from the article, making it harder for the article to attain a suitable temperature for printing and necessitating the use of higher printing temperatures, which is generally undesirable. It is nevertheless possible to produce satisfactory prints using apparatus in which the support has higher thermal conductivity than that of the member. At least in embodiments intended for use in printing on articles of thermoplastic materials, the support should be comparatively hard, rigid and non-deformable.

The voids in the foamed material serve to make the material more compliant and deformable. Hence the voids are used in the heat-conductive member on the printing side in order to allow good conformation between the member and the combination of carrier sheet and article to be printed. The voids have the undesirable side effect of reducing the thermal conductivity of the material. This effect is more than compensated by adding thermally conductive filler material to the composition. In the case of the support, the material should not be too soft and deformable, or it will not be capable of providing the desired mechanical support. For this reason, it is preferred that there should be no voids present. It is also desired that the thermal conductivity should be lower than that of the other member. The absence of voids is a disadvantage from this point of view. However, the desired result can be achieved by not incorporating the thermally conductive filler in the support.

The support is preferably not heated during printing, to reduce exposure of the article to heat, and also for more rapid cooling of the article after printing.

The apparatus may include cooling means for cooling the article after printing and after removal of the member. For instance, means such as a fan may be provided for directing a flow of cold air over the printed surface of the article. Additionally or alternatively, the support may have an associated coolable member.

The support is typically vertically below the member in use of the apparatus, but this is not essential.

The apparatus is typically designed for use with a particular article, with the member, and support if present, being tailored to the exact shape of that particular article.

The specification of International Patent Application No. PCT/GB02/00037 also discloses a method of printing an image on an image-receiving surface of an article, comprising holding a carrier sheet bearing an image to be printed in contact with said image-receiving surface of the article by means of a heat-conductive member comprising foamed polymeric elastomer material and having a surface shaped to be substantially complementary to said image-receiving surface of the article; and heating the member to print the image on said surface.

The image on the carrier sheet may be produced by a variety of different printing techniques, including dye diffusion thermal transfer printing, using appropriate carrier sheet material.

For example, a dye diffusion thermal retransfer printing process using a retransfer intermediate sheet as discussed above may be adopted. A retransfer intermediate sheet typically comprises a supporting substrate having a dye-receptive coating, or receiver layer, on one surface thereof, e.g. as described in EP 409514, with the other surface optionally carrying a coating to improve the friction, release or static properties of the sheet during printing and preferably also carrying the heat-resistant backcoat, as described in EP 912349 (WO98/02315). The substrate may comprise paper, possibly polyolefin-coated paper, with the preferred substrate comprising a laminated material prepared by laminating an opaque, voided polypropylene film to at least one side of a cellulose paper base material, e.g. as disclosed in JP 06-84119-B. The voids in the polypropylene film layer improve the compliance of the sheet.

The substrate is preferably not too stiff or inelastic, at least at printing temperatures and preferably also at ambient temperature, at least for use in printing on a compound curved surface (concave or convex) of an article, such as a part spherical surface having curvature in two planes, to enable the sheet to conform to the surface without creasing. It may be desirable to pre-heat the sheet prior to holding the sheet in contact with the article so that the sheet is in softened condition and more readily able to conform to the shape of the surface. Such pre-heating can be achieved by radiant heat from the member in heated condition, being held in close proximity to the sheet located on the image-receiving surface of the article (but not held in contact therewith), prior to contact of the sheet by the member and application of force to press the sheet into engagement with the article.

The image-receiving surface of the article may optionally be coated with suitable material to enhance susceptibility of the surface to printing, in known manner. Examples of suitable coating materials are given in U.S. Pat. No. 5,643, 387 at column 2 lines 23 to 52. U.S. Pat. No. 4,943,684 and EP 721848 also disclose coating materials suitable for use on ceramic articles.

The method and apparatus disclosed in PCT/GB02/00037 are thus applicable to printing on articles of a wide range of materials, including thermoplastic materials as well as metals and ceramic materials, and in a wide range of shapes, including printing on flat surfaces as well as on more complex, curved shapes (concave or convex) including compound curves. This approach can thus be used for printing on articles such as casings of mobile telephones made of polymers such as polycarbonate that soften and would otherwise distort under printing conditions of temperature and pressure. With such articles even slight distortion is unacceptable because the article must meet tight tolerances to fit correctly with other components.

Thermal transfer printing of an image onto an article of plastics material, as compared with an article of a high thermal stability material such as ceramic or metal, is a much more difficult, sensitive process, requiring better temperature control in the article to avoid unwanted distortions resulting from flow of the plastic. Conversely, it is necessary to use relatively high transfer temperatures in order to produce good quality high density colour images. It is known to use a two stage process for thermal transfer of an image onto an article of plastics material, with the first stage involving dye transfer by sublimation and the second stage involving dye fixation by use of rapid infra-red heating: see FR 2728505.

JP 3132862 discloses a mass retransfer system in which an image on a carrier sheet is mass transferred to an article of plastics material. The article bears an image-receiving layer of lower softening point than that of the plastics material. The image-receiving layer is designed to provide high adhesion with the material to be printed, and so is unsuitable for receiving an image by a dye thermal transfer process where efficient release of the carrier and image-receiving layer is required.

SUMMARY OF THE INVENTION

One aspect of the invention provides an article for receiving an image by thermal transfer printing, the article including an image-receiving surface of plastics material coated with a layer of dye-receptive material capable of accepting an image by means of a dye thermal transfer process, wherein the glass transition temperature (Tg) of the dye-receptive material is at least 50° C. lower than the softening point of the plastics material of the image-receiving surface.

An image can be printed on the image-receiving surface of the article by a dye diffusion thermal transfer process as described above in relation to PCT/GB02/00027, conveniently using apparatus as described in PCT/GB02/00037 including a support for the article. In this case, a carrier sheet of material bearing an image to be printed is held in contact with the image-receiving surface of the article by the member, via the complementary surface of the member. Typically, a sheet is located on the article in an appropriate position and the member is brought into contact with the exposed face of the sheet and force applied to exert pressure on the sheet sufficient to promote wetting contact between the sheet and the member. The member is heated by the heating means, possibly being pre-heated to a desired temperature prior to contact with the sheet and/or prior to contact of the sheet with the article. The sheet is held in contact with the article for a suitable time with the member at a suitable temperature to print the image on the surface of the article. Suitable printing conditions can be readily determined by experiment. The member is removed and the article allowed or caused to cool to ambient temperature. The sheet is usually removed from the article surface.

By having a difference between the softening point (which is also known as the mould temperature) of the plastics material of the article surface and the Tg of the material coated thereon of at least 50° C., preferably at least 60° C., more preferably at least 65° C., the inventors have found it possible to achieve printing in a single step transfer process of high density images without distortion of the plastics material. As noted above, pressure is generally used to obtain wetting contact between the carrier sheet and the dye-receptive coating on the article. In order to prevent distortion of the plastics material of the article during such a transfer process it is necessary for the temperature of plastics material not to exceed the softening point of the material. This requirement therefore constrains the temperature at which thermal transfer of the image can be carried out in a way that would normally result in loss of optical density of the image on transfer. While such loss of optical density may be overcome by increasing the transfer time, this in turn results in a reduction in image sharpness and quality. However, because the Tg of the dye-receptive coating is substantially lower (by at least 50° C.) than the softening point of the plastics material, in accordance with the invention, this enables the transfer process to be carried out at a temperature that results in good transfer optical densities without exceeding the softening point of the plastics material (and so not affecting the integrity of the article) and without compromising image sharpness and quality.

The dye-receptive coating material should be selected having regard to factors including the softening point of the plastics material of the image-receiving surface of the article.

The dye-receptive coating material should have a Tg of at least 30° C. in order to produce an image of adequate stability on the printed article under normal conditions of use: if the Tg is too low, the dye is likely to migrate in the material, affecting image quality. The dye-receptive coating preferably has a Tg of at least 45° C. A coating with a Tg in the range 45–50° C. generally provides good image stability; furthermore, there are available a wide range of plastics materials having a softening point at least 50° C. higher than this range and so suitable for use as the image-receiving surface of the article. Suitable coating materials can be readily selected by one skilled in the art, and include polyesters, acrylic materials, polyvinyl chloride (PVC) etc. The coating material preferably comprises a cross-linked polymer, e.g. cross-linked with a mould releasing agent to be discussed below. The polymer is preferably lightly cross-linked: if the level of cross-linking is too high dye penetration is inhibited thereby reducing print densities, whereas if the level of cross-linking is too low the coating is liable to flow and stick to a carrier sheet in use. The molecular weight of units between cross-linkable functional groups of the polymer is preferably greater than 900 and less than 10,000 to confer a suitable level of light cross-linking. Suitable coating materials are commercially available The dye-receptive coating material may be mixed with a suitable solvent or thinner to give an appropriate consistency.

The dye-receptive coating preferably includes one or more suitable mould releasing agents, such as silicones, fluorocarbons and alkyl resins. Suitable materials are commercially available and are known to those skilled in the art. Such agents function to prevent sticking of a carrier sheet to the image-receiving surface. Ideally, the mould releasing agent is cross-linked with a polymeric dye-receptive coating material, as discussed above.

The dye-receptive coating material may be applied to the image-receiving surface of the article in any convenient way, as will be known to those skilled in the art, eg by spraying, painting, dip coating, spin coating, screen printing etc., usually followed by drying and curing. Spraying is the currently preferred technique.

The dye-receptive coating conveniently has a thickness in the range 10 to 50 microns.

At least the image-receiving surface of the article is of plastics material, but in a typical case all of the article is of the plastics material. The plastics material is typically a thermoplastic material, and suitable plastics materials having appropriate softening points include ABS (a ter polymer composed of three different monomers, Acrylonitrile: Butadiene: Styrene), blends of ABS with other polymers e.g. polycarbonate (ABS/PC), acrylic resins, polycarbonates, polysulphones, polyethersulphones (PES), polyether ether ketones (PEEK) etc.

The article may have a wide variety of forms and shapes, including three-dimensional articles possibly having complex, curved shapes (concave or convex) including compound curves. The invention finds application, for instance, in printing of articles such as casings of mobile telephones made of polymers such as polycarbonate.

Printing on an article in accordance with the invention is conveniently carried out using a dye diffusion thermal transfer method (usually a retransfer method) as disclosed in GB 0100330.0, as described above, e.g. using carrier sheets (usually retransfer intermediate sheets) and apparatus as described above.

In a further aspect, the invention thus provides a method of printing an image by dye thermal transfer on an image-receiving surface of an article in accordance with the invention, comprising holding a carrier sheet bearing an image to be printed in contact with said surface, and heating the carrier sheet to print the image on said surface.

The carrier sheet is heated to a temperature above the Tg of the coating but not exceeding the softening point of the plastics material.

The invention also includes within its scope an article bearing a printed image produced by this method.

The invention will be further described by way of illustration, in the following examples which used apparatus as described in PCT/GB02/00037, as illustrated in the accompanying drawings, in which.

DETAILED DESCRIPTION OF THE DRAWINGS

Figure 1:
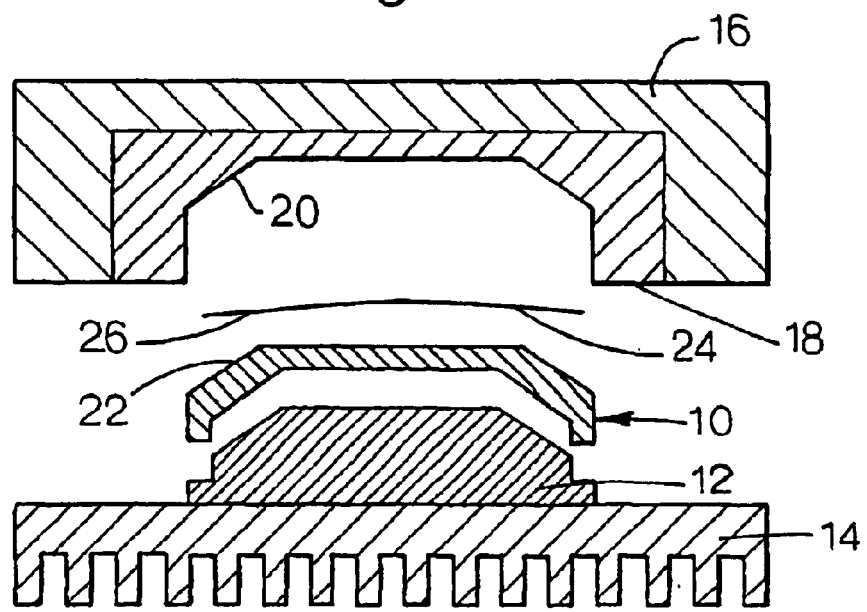
FIG. 1 is a schematic sectional view of printing apparatus.

Referring to the drawings, the illustrated apparatus comprises a printing press designed to print an image onto a surface of a plastics article 10 moulded from high temperature ABS/PC polymer (Bayblend T45 MN (Bayblend T45 MN is a Trade Mark) manufactured by Bayer AG) having a softening point of 110° C. by a dye diffusion thermal retransfer printing process.

The apparatus comprising a support 12 of silicone resin, which is a precisely moulded part shaped to fit exactly within the article 10. The support is mounted on a coolable backing plate 14.

The apparatus further comprises a heatable aluminium element 16, having the general form of an inverted open box. Element 16 has associated electric heaters (not shown) either inserted therein or attached to the major outer face thereof. Element 16 carries a rubber-like foam member 18, the inner surface 20 of which is shaped to be complementary to the outer face 22 of the article 10. Member 18 is formed of foamed silicone resin containing both gas-filled voids and thermally conductive particles.

Figure 2:
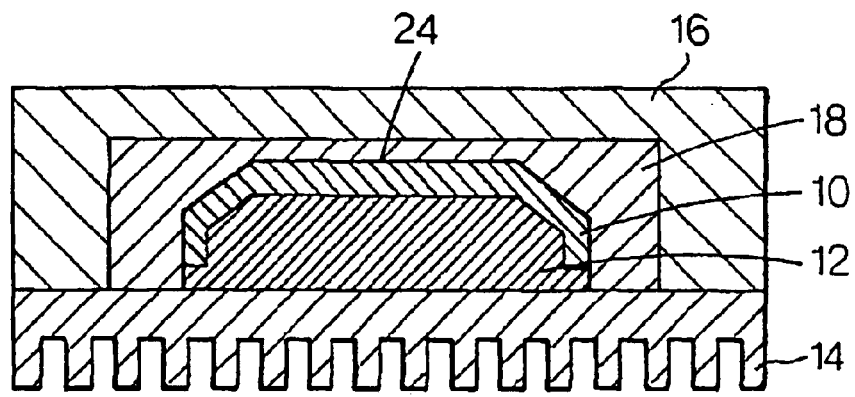
FIG. 2 is a view similar to FIG. 1, showing the apparatus in use.

In use, the article 10 is fitted on support 12. A retransfer intermediate carrier sheet 24, bearing an image to be printed on one face 26, produced by dye diffusion thermal transfer printing as discussed above, is located on the outer face 22 of the casing, with the image positioned over the region of the article on which it is desired to print. Element 16 is heated, thus heating member 18 by conduction. The member 18 is pre-heated in this way until it is at a temperature above the retransfer printing temperature, typically being up to about 200° C. Heat radiating from the surface 20 of member 18 will heat up, and may cause softening of, sheet 24. The member 18 (and associated heater 16) are moved into contact with the sheet 24 and exposed regions of the article outer face 22, to the position shown in FIG. 2, and suitable force applied by a spring loaded arrangement (not shown) to press the sheet 24 into engagement with the surface 22 of the article. In this position, the article 10 is fully enclosed between support 12 and member 18. This condition is maintained for a suitable time, typically about 1 or 2 minutes. During this time the sheet and image and also the article are rapidly heated to a temperature at which dye diffuses to the article surface, creating a durable image. The entire apparatus may optionally be located in a suitable enclosure and air evacuated to ensure good contact between the sheet and article during printing.

Any air trapped between the article and the sheet will inhibit the transfer of the dye on printing and give rise to unprinted spots on the article. This can be avoided by extracting the air from the press prior to closing it or by arranging the shape of the foam to squeeze the air out progressively from the point of contact to the edges as the press is cooled. This can be achieved, e.g., by having a slight dome (not shown) in the centre of member surface 20 so that as pressure is progressively applied an outwardly enlarging area of contact between the surface 20 and the sheet 24 and article face 22 is progressively formed, moving from the centre to the edges and forcing out air.

The foam of member 18 is soft enough to conform closely to the surface 22 of the article, deforming to accommodate any differences in shape, and so ensuring uniform contact. The voids provide sufficient elasticity to maintain an even pressure despite dimensional variations between components. The particles give sufficient heat capacity and thermal conductivity to ensure that the image reaches and stays at the retransfer temperature for the required period of time. The support is shaped to prevent the article deforming even though the retransfer may take place at a temperature above the softening temperature of the article material.

After printing, the press is opened by raising the member 18 and element 16, leaving the article 10 and sheet 24 on the support 12. The thermal conductivity of the support is such as to allow the casing to cool quickly to below its softening temperature. Cooling may be assisted by directing cold air over the casing. After cooling, the article 10 can be removed from the support without risk of distortion of the article. The sheet 24 can be peeled off the casing, leaving a printed image on the surface 22.

Member 18 is made of a silicone resin foam containing 40% w/w of aluminium powder which was prepared as follows: 20 grams of Silastic 'S' silicone base (Dow Corning) (Silastic 'S' is a Trade Mark) were mixed vigorously with 13.3 grams of fine aluminium powder of particle size 3–30 microns (Fisher Chemicals A/1605/53) to form a finely aerated paste. Then 2 grams of Silastic 'S' curing agent were mixed in. The resulting paste was cast into a slab and cured at 100° C. for 3 minutes. The volume fraction of aluminium powder is limited by the thickening of the paste and the need to retain flexibility in the cured resin. Tile volume composition of the foam material is 71% resin, 18% metal, 11% voids.

Support 12 was made of the same silicone resin, but in non-voided form and without added aluminium powder.

EXAMPLES

Example 1

The ABS/PC polymer articles 10 was coated (by spraying) with the following dye-receptive clear coating formulations.

1. PPG Clearcoat (PPG Clearcoat is a Trade Mark) paint lacquer having a Tg of 67° C. comprising resin 84-46-0008 (10 g), cross-linking hardening agent 87010002 (5 g), and thinner 89060001 (5 g). The Clearcoat lacquer was made from the 3 components in accordance with the manufacturers instructions.

The softening point of the ABS/PC (110° C.) was 43° C. higher than the Tg of the PPG Clearcoat paint lacquer. This coated article is not in accordance with the invention, and is included for comparative purposes.

2. A coated article in accordance with the invention was made using a coating having the following formulation:

| 1. | Dynapol LH833 (50%) | 1.5 kg |
| 2. | Silwet L77 | 10.00 g |
| 3. | Additol XL123 | 7.95 g |
| 4. | Tegomer 2711 | 1.98 g |
| 5. | Uvitex OB | 1.30 g |
| 6. | Tinuvin 144 | 7.90 g |
| 8. | DABCO T12 | 0.50 g |
| 9. | Butyl Acetate | 583.0 g |

Dynapol LH833, Silwet L77, Additol XL123, Tegomer 2711, Uvitex OB, Tinuvin 144 and DABCO T12 are all Trade Marks. Dynapol LH833 is a polyester, supplied as a 50% by weight polymer solution in solvesso 150 solvent. Silwet L77 is an alkoxy silicone used to give very good substrate wetting. Additol XL123 is a silicone based flow agent to prevent surface defects. Tegomer 2711 is a hydroxy end functional poly dimethyl siloxane release agent. Uvitex OB is an optical brightener to ensure the coating appears white. Dabco T12 is an isocyanate cross-linking catalyst. Truvin 144 is a hindered amine to prevent uv degradation of the polyurethane coating. Butyl acetate is a solvent.

The ingredients were mixed together with 200 g of the PPG isocyanate cross-linking agent 87010002 as used in formulation 1 (i.e. at a weight ratio of 10.6:1 coating ingredients:cross-linking agent) to produce a cross-linked coating having a Tg of 48° C., i.e. 62° C. lower than the softening point of the ABS/PC of the articles 10.

The coated articles were oven cured for 30 minutes at 80° C. and left to stand for one week before being subject to a retransfer step. The re-transfer step was carried out using the re-transfer apparatus described above with reference to FIGS. 1 and 2, using an image on a retransfer intermediate sheet of VP retransfer paper from ICI Imagedata. The retransfer paper comprises a 128 gsm paper core laminated on both sides with a 35 microns thick commercial pearl film such as Toyopearl SS (Toyopearl SS is a Trade Mark). The upper layer of the substrate is coated with a filled whitening layer upon which the receiver layer is coated. The member 18 was heated to a temperature of 200° C., giving an interfacial temperature of less than 110° C. When the press was closed, the article 10 was subjected to a pressure of 500 Newtons for 90 seconds. The press was then opened and the article left on the support to cool, with a flow of air being directed over the support and shell for 30 seconds for additional cooling effect.

A full colour (black, cyan, magenta, yellow) image was transferred into the coatings on the articles in this way. The neutral optical density of the images in the coating was measured with a Macbeth TR-1224 densitometer in reflection mode, and the article checked for distortion. The results are set out in the Table below.

| Coating | Yellow | Magenta | Cyan | Black | Distortion |
|---------|--------|---------|------|-------|------------|
| 1 | 0.88 | 0.85 | 0.4 | 0.82 | N |
| 2 | 2.16 | 1.67 | 0.92 | 2.04 | N |

The coated article in accordance with the invention (coating 2) clearly gives images with higher dye densities than those obtained using coating 1. When further tests were carried out printing on coating 1 at higher retransfer temperatures the plastic article distorted.

Example 2

A series of further coatings were prepared, generally similar to coating 2 of Example 1, using Dynapol LH833 as before and also Vylon GK130 (Vylon GK130 is a Trade Mark) which is a low molecular weight, low Tg, hydroxyl functional linear polyester. Coating formulations were as follows:

| | | | |
|---|---|---|---|
| 1. | Polymer | 0.75 | kg |
| 2. | Silwet L77 | 10.00 | g |
| 3. | Additol XL123 | 7.95 | g |
| 4. | Tegomer 2711 | 1.98 | g |
| 5. | Uvitex OB | 1.30 | g |
| 6. | Tinuvin 144 | 7.90 | g |
| 8. | DABCO T12 | 0.50 | g |
| 9. | Butyl Acetate | 583.0 | g |

The resin systems were mixed together with PPG isocyanate crosslinking agent 87010002 as used in the previous example to produce cross-linked coatings. Further ABS/PC polymer articles 10 (as used in Example 1) were coated with the cross-linked coating formulations, using a dip coating process in place of spray coating as in Example 1. The coated articles were cured at 90° C. for 50 minutes before being printed by a retransfer printing operation, as described in Example 1.

The dye retransfer optical densities were measured using a Gretag SPM50 spectrophotometer (Gretag SPM50 is a Trade Mark) and the articles were checked for any distortion. Results were as follows:

| Resin system | Resin: Crosslinker ratio | Glass Transition Tg ° C. | Retransfer optical density | | | |
|---|---|---|---|---|---|---|
| | | | y | m | c | k |
| Dynapol LH833 | 10:1 | 48 | 1.95 | 1.87 | 1.18 | 1.96 |
| Dynapol LH833 + 30% w/w TiO$_2$ filler | 10:1 | 48 | 1.82 | 1.75 | 1.14 | 1.91 |
| Vylon GK130 | 10:1 | 30 | 2.19 | 2.07 | 1.37 | 2.20 |

All the samples exhibited a Tg difference of greater than 50° C. compared with the plastic part. All the samples gave good retransfer densities.

It should be noted that the test pattern used to print the above samples was different to that used in Example 1. The above testing was carried out with maximum density Y, M, C and K bars whereas the earlier test samples used full power Y & K, but lower power M and C. Coating 2 of Example 1 is identical to the first entry in the table above, and the Y and K density data for the two coatings show reasonably good agreement.

What is claimed is:

1. An article for receiving an image by thermal transfer printing, the article including an image-receiving surface of plastics material coated with a layer of dye-receptive material capable of accepting an image by means of a dye thermal transfer process, wherein the glass transition temperature (Tg) of the dye-receptive material is at least 50° C. lower than the softening point of the plastics material of the image-receiving surface.

2. An article according to claim 1, wherein the Tg of the dye-receptive material is at least 60° C. lower than the softening point of the plastics material of the article surface.

3. An article according to claim 1 or 2, wherein the dye-receptive coating material has a Tg of at least 30° C.

4. An article according to claim 3, wherein the coating material has a Tg in the range 45–50° C.

5. An article according to claim 1, wherein the dye-receptive coating material is selected from: polyesters, acrylic materials and polyvinyl chloride.

6. An article according to claim 1, wherein the dye-receptive coating material comprises a cross-linked polymer.

7. An article according to claim 6, wherein the degree of cross-linking is such that the molecular weight of units between cross-linkable functional groups of the polymer is greater than 900 and less than 10,000.

8. An article according to claim 1, wherein the dye-receptive coating includes one or more mould releasing agents.

9. An article according to claim 8, wherein the mould releasing agent is cross-linked with a polymeric dye-receptive coating material.

10. An article according to claim 1, wherein the dye-receptive coating has a thickness in the range 10 to 50 microns.

11. An article according to claim 1, wherein the plastics material of the image-receiving surface is a thermoplastic material.

12. An article according to claim 11, wherein the plastics material is selected from: ABS, blends of ABS with other polymers, acrylic resins, polycarbonates, polysulphones, polyethersulphones and polyether ether ketones.

13. An article according to claim 1, wherein the article is a three-dimensional article: possibly having complex, curved shapes (concave or convex) including compound curves.

14. An article according to claim 1, comprising a casing of a mobile telephone.

15. A method of printing an image by dye thermal transfer on an image-receiving surface of an article in accordance with claim 1, comprising holding a carrier sheet bearing an image to be printed in contact with said surface, and heating the carrier sheet to print the image on said surface.

16. An article bearing a printed image produced by the method of claim 15.

17. An article according to claim 2 wherein the Tg of the dye-receptive material is at least 65° C. lower that the softening point of the plastics material of the article surface.

18. An article according to claim 3 wherein the dye-receptive coating material has a Tg of at least 45° C.

* * * * *